(12) United States Patent
Liebmann

(10) Patent No.: US 6,185,727 B1
(45) Date of Patent: Feb. 6, 2001

(54) DESIGN VERIFICATION FOR ASYMMETRIC PHASE SHIFT MASK LAYOUTS

(75) Inventor: Lars Wolfgang Liebmann, Dutchess County, NY (US)

(73) Assignee: International Business Machines Corporation, Armonk, NY (US)

(*) Notice: Under 35 U.S.C. 154(b), the term of this patent shall be extended for 578 days.

(21) Appl. No.: 08/570,851

(22) Filed: Dec. 12, 1995

(51) Int. Cl.$^7$ ................................................... G06F 17/50
(52) U.S. Cl. ........................... 716/19; 716/21; 430/5; 430/394; 430/396
(58) Field of Search ..................... 395/500; 364/488, 364/489, 490, 491; 716/19, 21; 430/5, 394, 396, 311

(56) References Cited

U.S. PATENT DOCUMENTS 5,537,648 * 7/1996 Liebmann et al. ..................... 716/19
5,573,890 * 11/1996 Spence .................................. 430/311

OTHER PUBLICATIONS

Nistler, et al., "Large-area Optical Design Rule Checker for Logic PSM Application", Proceedings of SPIE—The Int'l Society for Optical Engineers v2254, 1994, pp. 78–92 (abstract only).

Waas, et al., "Automatic Generation of Phase Shift Mask Layouts", Elsevier Science, 1994, pp. 139–142.

Galan, et al., "Application of Alternating-Type Phase Shift Mask to Polysilicon Level for Random Logic Circits", Jpn. J. Appl. Phys. v33, 1994.

Levenson, "Extending the Lifetime of Optical Lithography Technologies with Wavefront Engineering", Jpn. J. Appl. Phys. v33, 1994, pp. 6765–6773.

* cited by examiner

Primary Examiner—Paul R. Lintz
Assistant Examiner—Vuthe Siek
(74) Attorney, Agent, or Firm—McGuireWoods LLP; Eric E. Petraske

(57) ABSTRACT

A checking routine verifies a phase shifted mask (PSM) design based on fundamental principles of PSM and utilizing only basic shape manipulation functions and Boolean operations found in most computer aided design (CAD) systems. The design verification system checks complete chip designs for the two possible design errors that can cause defective masks by eliminating the phase transition; namely, placing a 180° phase region on both sides of a critical feature or completely omitting the phase region adjacent to certain critical features.

8 Claims, 3 Drawing Sheets

DESIGN VERIFICATION FOR ASYMMETRIC PHASE SHIFT MASK LAYOUTS

CROSS-REFERENCE TO RELATED APPLICATION

The subject matter of this invention is related to that in copending application Ser. No. 08/290,625 filed Aug. 15, 1994, by Lars W. Liebmann, Mark a Lavin, and Pia N. Sanda for "Geometric Autogeneration of 'Hard' Phase-shift Designs for VLSI", assigned to a common assignee with this application. The disclosure of application Ser. No. 08/290,625 is incorporated herein by reference.

BACKGROUND OF THE INVENTION

1. Field of the Invention

The present invention generally relates to the manufacture of very large scale integrated (VLSI) circuit devices and, more particularly, to the resolution enhancement of photolithographic images through the use of phase shifted masks (PSMs).

2. Background Description

Manufacturing of semiconductor devices is dependent upon the accurate replication of computer aided design (CAD) generated patterns onto the surface of a device substrate. The replication process is typically performed using optical lithography followed by a variety of subtractive (etch), additive (deposition) and material modification (e.g., oxidations, ion implants, etc.) processes. Optical lithography patterning involves the illumination of a metallic coated quartz plate known as a photomask which contains a magnified image of the computer generated pattern etched into the metallic layer. This illuminated image is reduced in size and patterned into a photosensitive film on the device substrate. As a result of the interference and processing effects which occur during pattern transfer, images formed on the device substrate deviate from their ideal dimensions and shape as represented by the computer images. These deviations depend on the characteristics of the patterns as well as a variety of process conditions. Because these deviations can significantly effect the performance of the semiconductor device, many approaches have been pursued which focus on CAD compensation schemes which ensure a resultant ideal image.

Conventional photomasks consist of chromium patterns on a quartz plate, allowing light to pass wherever the chromium is removed from the mask. Light of a specific wavelength is projected through the mask onto a photoresist coated wafer, exposing the resist wherever hole patterns are placed on the mask. Exposing the resist to light of the appropriate wavelength causes modifications in the molecular structure of the resist polymers which allows developer to dissolve and remove the resist in the exposed areas. The photomask, when illuminated, can be pictured as an array of individual, infinitely small light sources which can be either turned on (points in clear areas) or turned off (points covered by chrome). If the amplitude of the electric field vector which describes the light radiated by these individual light sources is mapped across a cross section of the mask, a step function will be plotted reflecting the two possible states that each point on the mask can be found in (light on, light off).

These conventional photomasks are commonly referred to as chrome on glass (COG) binary masks, due to the binary nature of the image amplitude. The perfectly square step function exists only in the theoretical limit of the exact mask plane. At any distance away from the mask, such as in the wafer plane, diffraction effects will cause images to exhibit a finite image slope. At small dimensions, that is, when the size and spacing of the images to be printed are small relative to the ratio of the wavelength, $\lambda$, to the numerical aperture, NA, of the exposure system, electric field vectors of adjacent images will interact and add constructively. The resulting light intensity curve between the features is not completely dark, but exhibits significant amounts of light intensity created by the interaction of adjacent features. This resolution of an exposure system is limited by the contrast of the projected image; that is, the intensity difference between adjacent light and dark features. An increase in the light intensity in nominally dark regions will eventually cause adjacent features to print as one combined structure rather than discrete images.

The quality with which small images can be replicated in lithography depends largely on the available process latitude; that is, the amount of allowable dose and focus variation that still results in correct image size. Phase shifted mask (PSM) lithography improves the lithographic process latitude by introducing a third parameter on the mask. The electric field vector, like any vector quantity, has a magnitude and direction, so in addition to turning the electric field amplitude on and off, it can be turned on with a 0° phase or turned on with a 180° phase. This phase variation is achieved in PSMs by modifying the length that a light beam travels through the mask material. By recessing the mask by the appropriate depth, light traversing the thinner portion of the mask and light traversing the thicker portion of the mask will be 180° out of phase; that is, their electric field vectors will be of equal magnitude but point in exactly opposite directions so that any interaction between these light beams results in perfect cancellation. For more information on PSMs, the reader is referred to "Phase-Shifting Mask Strategies: Isolated Dark Lines", Marc D. Levenson, *Microlithography World*, March/April 1992, pp. 6–12.

Phase edge PSM lithography makes use of contrast enhancement afforded by a phase transition under a narrow opaque feature on the mask. This phase transition is caused by an appropriate difference in the path length of the light in the quartz mask substrate on either side of the narrow opaque feature. The path length difference is achieved on the PSM by either depositing or removing transparent mask material selectively on one side of the narrow opaque feature. The asymmetric nature of this mask topography modification forces a deliberate second patterning operation to define areas in which material is to be removed or deposited after the opaque patterns have been formed in the metallic mask coating with a first patterning operation. The complexity of the design of these phase regions in which the mask topography is to be modified has been one of the major inhibitors for full scale insertion into VLSI manufacturing. Methods for the automatic design of these phase edge PSMs are now becoming available. See, application Ser. No. 08/290,625, supra, T. Waas et al., "Automatic Generation of Phase Shift Mask Layouts", Microelectronic Engineering, Elsevier Science B.V. (1994), pp. 139–142, and Gerald Calan et al., "Application of Alternating-Type Phase Shift Mask to Polysilicon Level for Random Logic Circuits", *Jpn. J. Appl. Phys.*, Vol. 22 (1994). As a result, attention has to shift towards efficient verification of the automatically generated designs. Design errors can cause defective masks by eliminating the phase transition, either by placing a 180° phase region on both sides of the critical feature or by completely omitting the phase region adjacent to certain features.

SUMMARY OF THE INVENTION

It is therefore an object of the present invention to provide a checking routine for the verification of a PSM design based on fundamental principles of PSM and utilizing only basic shape manipulation functions and Boolean operations found in most CAD systems.

According to the invention, there is provided a design verification system which checks complete chip designs for the two possible design errors that can cause defective masks by eliminating the phase transition; namely, placing a 180° phase region on both sides of a critical feature or completely omitting the phase region adjacent to certain critical features.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The PSM design algorithm disclosed in application Ser. No. 08/290,625 allows binary mask layouts to be converted to phase edge.PSM layouts on a CAD system supporting basic Boolean operations. The present invention addresses the issue of verifying a phase edge PSM layout, generated by the routine disclosed in application Ser. No. 08/290,625 or any other design tool. The phase edge PSM design checker according to the invention can be implemented in any CAD system supporting basic shape manipulation and Boolean operations. For example, the invention can be implemented in a CAD application, such as IBM's Hierarchical shapes processing engine "Niagara", running on a workstation, such as an IBM RISC/6000 computer. It can also be implemented in other commercially available CAD systems, such as the CADENCE layout editor by Cadence Design Systems Inc., running on any supported workstation. It is also possible to include the PSM design verification as part of CAD design enhancement operations such as optical proximity correction using, for example, software packages from Trans Vector Technologies Inc. or Precim Inc. or any other CAD manipulation package that supports basic geometric and Boolean operations. Since it is possible that the final CAD data conversion for the phase edge PSMs will be supported by the mask making facility, not the original chip designer, it is possible to include the layout verification routine as part of the mask writer data preparation and fracturing operation, implemented on, for example, Transcription Enterprises CATS (computer aided transcription system) package.

Figure 1:
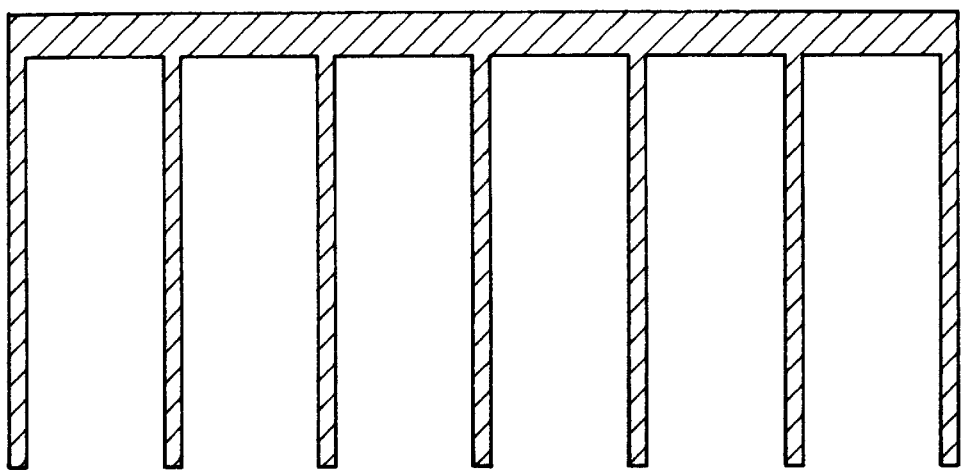
FIG. 1 is a plan view of a "comb" structure used to illustrate the principles of the design verification routine according to the invention.

Referring now to the drawings, and more particularly to FIG. 1, there is shown a simple "comb" structure to illustrate the design verification routine of the present invention. This comb structure consists of a wide horizontal bar that can be replicated in the standard lithography process without the need for phase shift mask resolution enhancement and narrow vertical prongs that, by virtue of their dimension, are deemed "critical" to the PSM design routine. While the term "critical" is used here to describe features that are narrower than the useful resolution limits of the lithography process without phase shift mask assistance, it is also true that these narrow features are, in general, the ones most critical to the electrical functionality of the resulting chip. For example, the comb structure used as an example can be found in the gate level of chip designs whenever it is necessary to turn on a series of gates (i.e., the prongs) at the same time by applying a voltage to the base of the comb.

Figure 2:
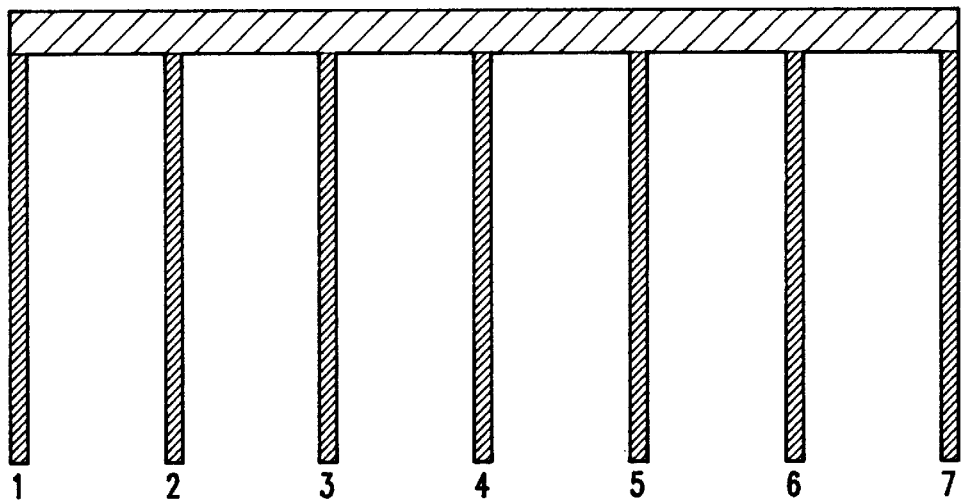
FIG. 2 is a plan view of the "comb" structure of FIG. 1 with the critical features requiring a phase transition shown in solid fill.

FIG. 2 shows this same "comb" structure with the "prongs" of the "comb" in solid fill to indicate that these are critical features requiring a phase transition. In this case, a search by minimum width is used to isolate "critical" features. It is also possible to locate critical features based on their role in the electrical functionality of the chip, using Boolean operations to sort based on interactions with other design levels. The search routine of the design checker, while preferably using different mathematical approaches than the original phase shift design routine, has to apply the same search criteria in locating "critical" features as were applied in the design. For easier reference, numeric labels have been applied to the prongs in FIG. 2 and the following figures.

Figure 3:
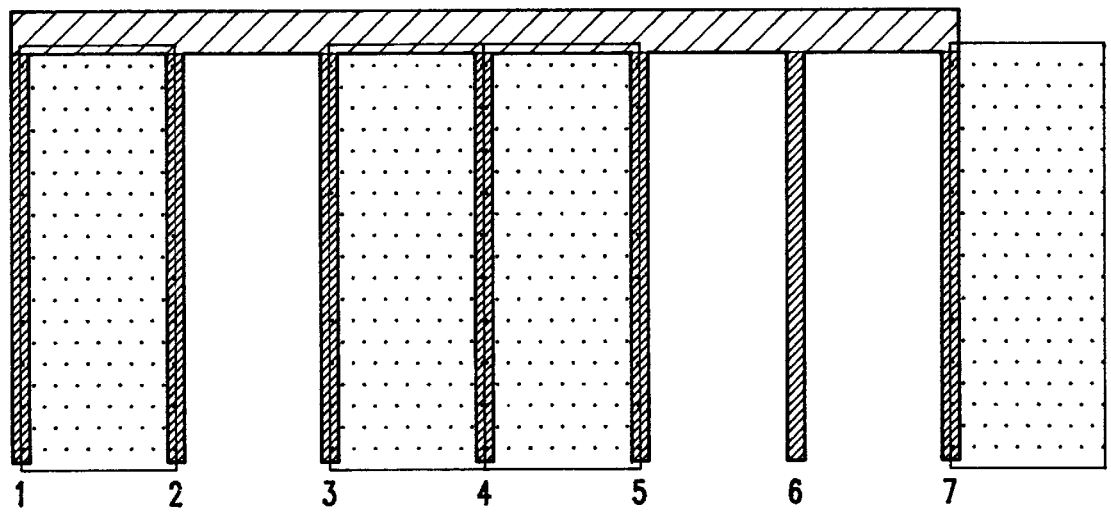
FIG. 3 is a plan view of the "comb" structure of FIG. 2 illustrating possible phase assignments of the prongs in the "comb" structure.

In FIG. 3, the first three prongs from the left show proper phase assignment, the fourth prong has no phase transition due to phase regions on either side, the fifth prong is designed correctly, the sixth prong has no phase transition due to lack of phase regions on either side, and the seventh prong is in order. The object of the phase shift design routine is to form a 180° phase region adjacent to one side of every "critical" feature, illustrated as the dotted region next to the solid black lines. For a variety of reasons, such as design routine errors, design rule violations in the original CAD layout, errors in the hierarchy management, or errors in locating "critical" features, it is possible that one or more "critical" features do not receive the proper phase region design. Design errors can exhibit themselves as either no phase region on either side of the "critical" structure or phase regions on both sides of the "critical" structure. Both errors result in a loss of phase transition across the "critical" feature and will cause that feature to be replicated very poorly in the lithography process. Most logic integrated circuit designs have no redundancy built into critical operations; i.e., a single "critical" feature that is not replicated properly will cause the entire chip to fail. Even chips with built in redundancy can be completely destroyed by a single misplaced phase region since the poor resolution on the narrow feature that does not benefit from phase shifting can cause this feature to be partially transferred into the photoresist and can break off and cause defects anywhere on the chip. Considering the significant cost of phase shifted masks and CMOS wafer processing, it is imperative to find design errors before a mask is built.

Reviewing the "critical" features in FIG. 3, starting from the left prong 1 sees a transition from white (unshifted) background to the phase region (indicated in dots), resulting in a proper phase transition. Prong 2 sees an equally valid transition from phase region to unshifted background. Prong 3 again sees a transition from unshifted background to phase region. Prong 4 is improperly designed with a phase region on either side of it, eliminating the enabling phase transition. Prong 5 once again is designed correctly with a transition from phase to unshifted background. Prong 6 is faulty due to a complete lack of phase region on either side. And, finally, prong 7 is designed correctly with a transition from unshifted background to phase region.

The object of the present invention is to use simple means available to most CAD systems to isolate the faulty prongs 4 and 6 from the rest of the design. While this exercise seems extremely trivial on the simple "comb" structure chosen for illustration, the process becomes very involved in a full hierarchical chip layout in which only the most basic geometric and Boolean operations can be performed in a reasonable time frame on state of the art workstations.

Figure 4:
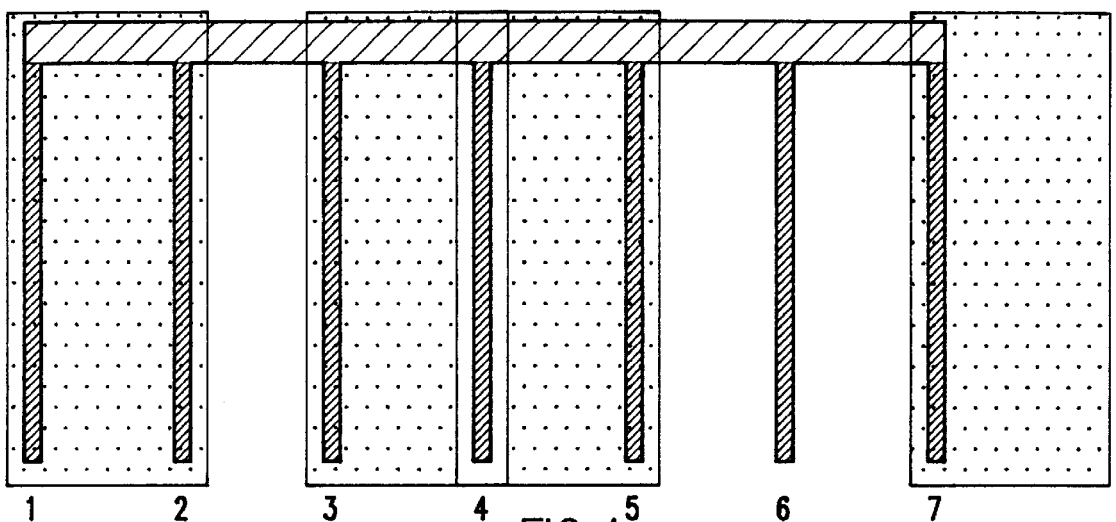
FIG. 4 is a plan view of the "comb" structure of FIG. 3 showing the first step in the routine according to the invention after locating the critical features.

FIG. 4 shows the result of expanding (anisotropic increase in size) the phase regions, leaving all properly designed "critical" features covered by a single incident of the phase region. Improperly designed "critical" features (e.g., prongs 4 and 6) will be covered either by multiple incidents of the phase region (prong 4) or by no phase region at all (prong 6). This first step is performed after locating the critical features and is an expansion of the phase regions by at least the maximum width of the critical features. Expansion has to be less than the minimum pitch; i.e., the largest critical dimension feature that requires PSM will always be smaller than the minimum pitch allowed in the design.

Figure 5:
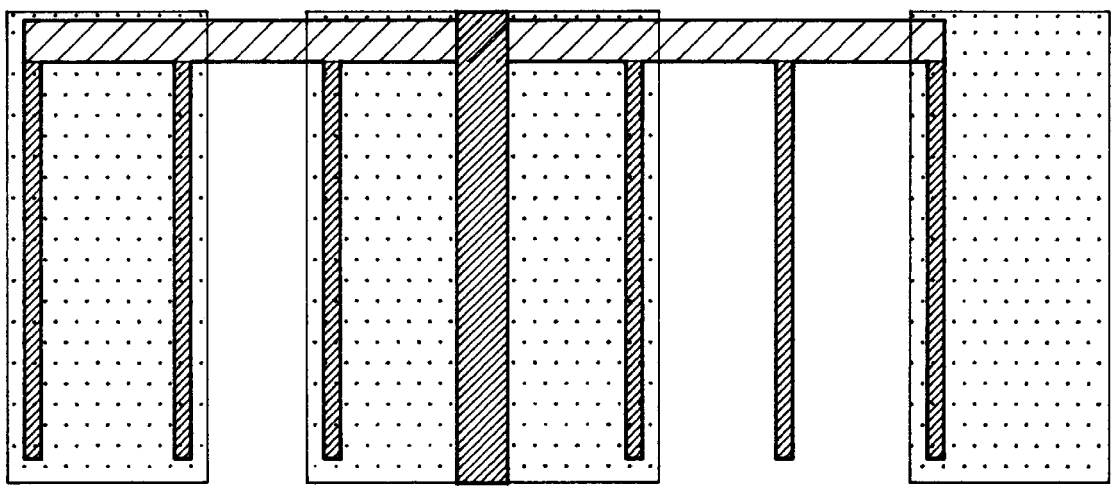
FIG. 5 is a plan view of the "comb" structure of FIG. 4 showing the use of an intersection operation to define a region of phase overlap.

In FIG. 5, using an intersection operation, shapes defining the region of phase overlap are created. The wide solid black bar over prong 4 is the result of a Boolean operation to locate overlaps between phase shapes.

Figure 6:
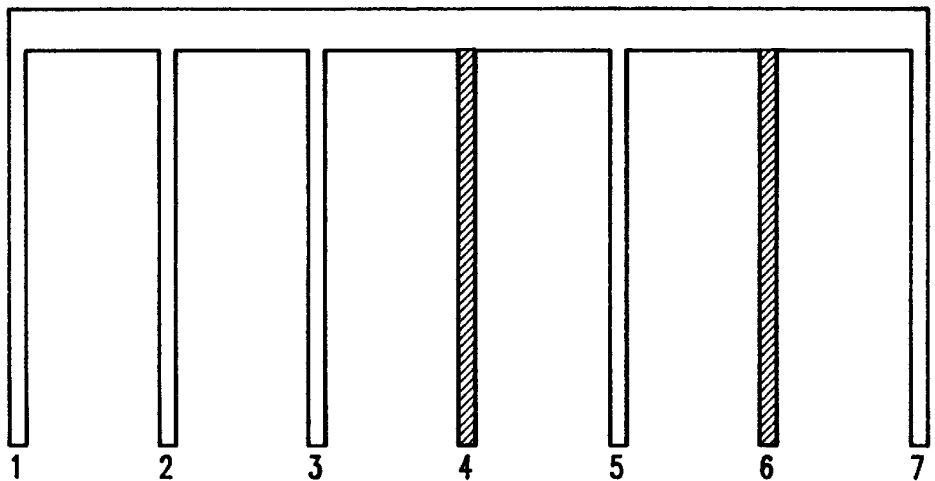
FIG. 6 is a plan view of the "comb" structure of FIG. 5 showing the isolation of critical dimension features with phase errors.

Then, in FIG. 6, design errors are highlighted by isolating critical dimension features that are either covered by the overlap regions (prong 4) or are not covered by an expanded phase region at all (prong 6). The features that are presented to the designer, either in graphical form or as a list of coordinates, as design conflicts are characterized as critical features that either have a phase region on both sides or have not adjacent phase region at all.

Figure 7:
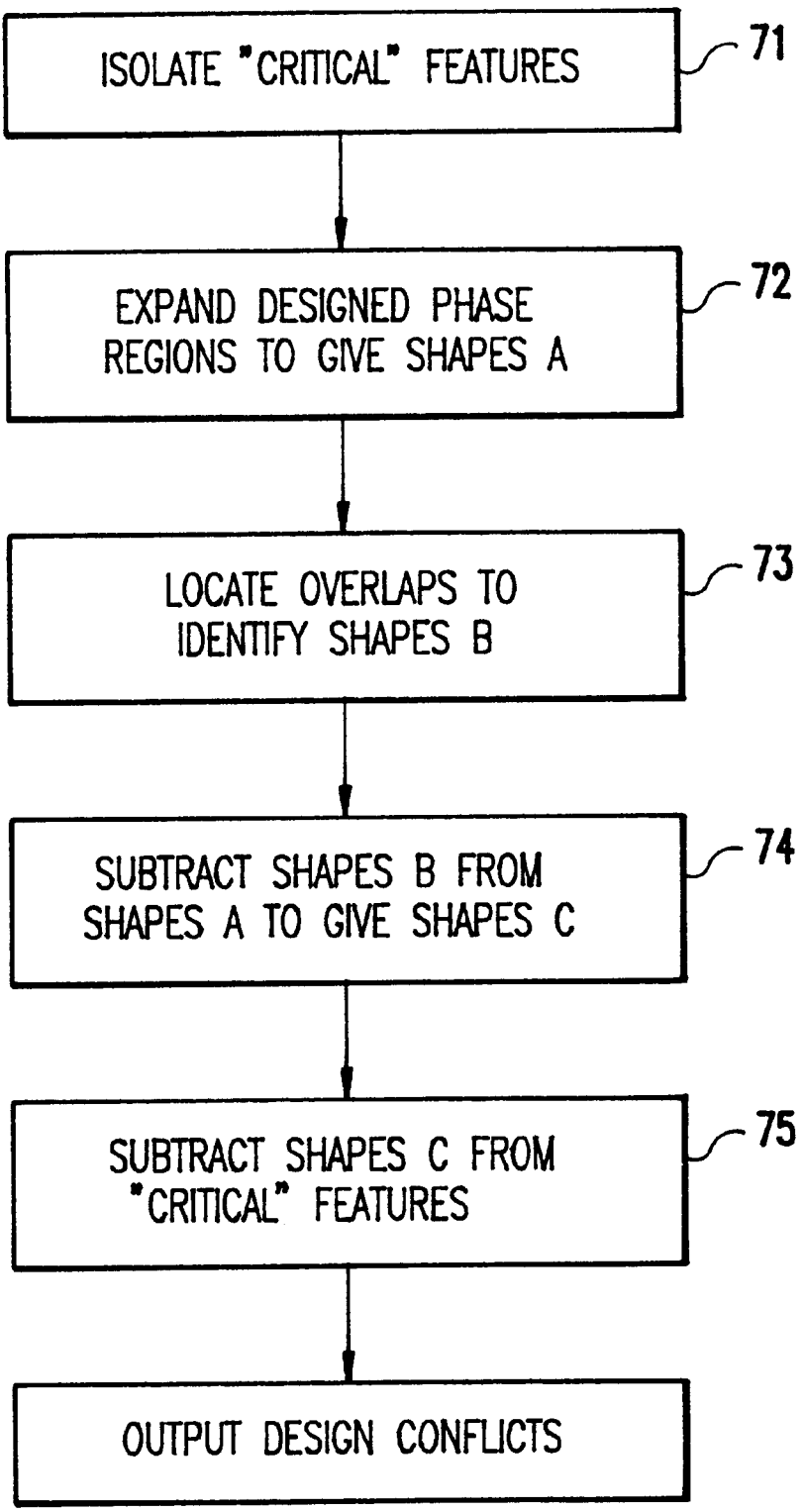
FIG. 7 is a flow chart illustrating the logic of the process implemented according to the invention.

FIG. 7 is a flow chart showing the logic of the process according to the invention. In function block 71, "critical" features are isolated based on the same size or functionality criteria that were applied in the original design routine. The designed phase regions are expanded in function block 72 by the width of the largest "critical" features to give shapes A. The location of all overlaps of the expanded phase regions (shapes A) identifies shapes B in function block 73. Now, with shapes A and B identified, the defective "critical" features are isolated by first subtracting in function block 74 the overlap region from the expanded phase region; i.e., A−B=C. Then, in function block 75, the remaining phase regions C are subtracted from the "critical" designs, leaving only "critical" features that were either covered by the overlap of two phase regions or were not covered by a phase region at all, as shown in FIG. 6.

While it is very easy for a human observer to isolate narrow features that do not exhibit a transition from phase to no phase, it is very difficult to code this logic into a CAD routine. The present invention makes this possible by using basic geometrical and Boolean operations that can be executed rapidly and hierarchically by most CAD systems. The design verification process can be used independent of how the initial phase design was derived; i.e., whether through the method described in application Ser. No. 08/290,625, supra, or through the "router" based methods described by Waas et al. and Calan et al., supra, or through more elaborate reverse image processing methods. The design verification method according to the invention is simple enough so that full chip designs can be verified on single processor based workstations in a matter of hours rather than days as in the image simulation based systems. This design verification is versatile enough to be implemented at the chip designer level (i.e., on a CAD layout editor) or during CAD enhancements (e.g., optical proximity correction) or during the mask writer data preparation. Design verification is done in a way that physically isolates the critical dimension shapes with design errors in the chip design, making it easy to locate the problematic designs for corrections. Further, phase region placement is verified directly in the design.

Although the invention has been described in terms of a single preferred embodiment, those skilled in the art will recognize that the invention can be practiced with modification within the spirit and scope of the appended claims.

Having thus described my invention, what I claim as new and desire to secure by letters patent is as follows:

1. A computer implemented method of design verification for asymmetric phase shift mask layouts comprising the steps of:

isolating "critical" features in a design based on criteria that were applied in an original design routine;

expanding the designed phase regions by the width of the largest "critical" features to give shapes A;

locating all overlaps of the expanded phase regions to identify shapes B;

isolating any defective "critical" features by first subtracting the overlap region shapes B from the expanded phase region shapes A to produce phase regions shapes C, and then subtracting the remaining phase regions shapes C from the isolated "critical" features, leaving only "critical" features that were either covered by the overlap of two phase regions or were not covered by a phase region at all; and presenting to a designer design conflicts characterized as "critical" features that either have a phase region on both sides or have no adjacent phase region at all.

2. The computer implemented method of design verification recited in claim 1 wherein the step of expanding the designed phase regions is performed using a simple geometrical operation and wherein subtracting is done using simple Boolean operations.

3. The computer implemented method of design verification recited in claim 2 wherein the step of presenting the designer design conflicts is performed by displaying the design conflicts in graphical form.

4. The computer implemented method of design verification recited in claim 2 wherein the step of presenting the designer design conflicts is performed by generating a list of coordinates in the design.

5. A computer implemented method of phase edge phase shift mask (PSM) design verification directly in a design of a very large scale integrated (VSLI) circuit design comprising the steps of:

geometrically expanding the designed phase regions;

identifying all overlaps of the expanded phase regions;

subtracting the overlaps of the expanded phase regions from the expanded phase regions using a Boolean difference operation to produce features that were either covered by the overlap of two phase regions or were not covered by a phase region at all; and displaying design conflicts that either have a phase region on both sides or have no adjacent phase region at all.

6. The computer implemented method of phase edge PSM design recited in claim 5 implemented on a computer aided design (CAD) layout editor.

7. The computer implemented method of phase edge PSM design recited in claim 5 implemented during computer aided design (CAD) enhancements.

8. The computer implemented method of phase edge PSM design recited in claim 5 implemented during mask writer data preparation.

* * * * *